United States Patent
Li et al.

(10) Patent No.: US 6,712,621 B2
(45) Date of Patent: Mar. 30, 2004

(54) THERMALLY ENHANCED INTERPOSER AND METHOD

(75) Inventors: Che-Yu Li, Roslyn, NY (US); Zhineng Fan, Sunnyvale, CA (US); Dirk D. Brown, Mountain View, CA (US)

(73) Assignee: High Connection Density, Inc., Sunnyvale, CA (US)

( * ) Notice: Subject to any disclaimer, the term of this patent is extended or adjusted under 35 U.S.C. 154(b) by 0 days.

(21) Appl. No.: 10/055,771

(22) Filed: Jan. 23, 2002

(65) Prior Publication Data

US 2003/0139071 A1 Jul. 24, 2003

(51) Int. Cl.[7] .......................... H01R 12/00; H05R 1/00
(52) U.S. Cl. ............................................ 439/65; 439/71
(58) Field of Search ........................... 439/65, 71, 485, 439/487; 361/704, 719, 776; 174/262

(56) References Cited

U.S. PATENT DOCUMENTS

| | | | |
|---|---|---|---|
| 4,628,409 A | * 12/1986 | Thompson et al. | 361/771 |
| 5,432,677 A | * 7/1995 | Mowatt et al. | 361/719 |
| 5,528,456 A | 6/1996 | Takahashi | 361/704 |
| 5,665,473 A | * 9/1997 | Okoshi et al. | 428/457 |
| 5,705,850 A | 1/1998 | Ashiwake et al. | 257/714 |
| 5,917,707 A | * 6/1999 | Khandros et al. | 361/776 |
| 5,982,635 A | * 11/1999 | Menzies et al. | 361/790 |
| 6,019,611 A | 2/2000 | McHugh et al. | 439/71 |
| 6,078,500 A | 6/2000 | Beaman et al. | 361/704 |
| 6,264,476 B1 | 7/2001 | Li et al. | 439/66 |
| 6,299,460 B1 | 10/2001 | Haselby et al. | 439/67 |
| 6,304,451 B1 | 10/2001 | Rife | 361/704 |
| 6,312,266 B1 | 11/2001 | Fan et al. | 439/91 |
| 6,317,326 B1 | 11/2001 | Vogel et al. | 361/704 |
| 6,448,509 B1 | * 9/2002 | Huemoeller | 174/262 |

* cited by examiner

Primary Examiner—Chandrika Prasad
(74) Attorney, Agent, or Firm—Duane Morris LLP

(57) ABSTRACT

The present invention provides a heat spreading connector suitable for use with electronic components including those using land grid arrays and pin grid arrays and a method for its use. The connector of the present invention includes at least one dielectric layer and at least one thermally conductive layer.

21 Claims, 14 Drawing Sheets

THERMALLY ENHANCED INTERPOSER AND METHOD

FIELD OF THE INVENTION

The present invention relates to devices for heat spreading and dissipation in electronic systems and, more particularly to heat dissipation devices useful for conducting heat away from semiconductor chips and their carriers, including land grid arrays.

BACKGROUND OF THE INVENTION

The performance of electronic circuits and their semiconductor devices is limited by temperature. Semiconductor device performance degrades when the internal temperature reaches or exceeds a particular limit. That limit depends upon the nature of the semiconductor device. There are often numerous semiconductor-related heat sources 2 within a typical electronic device, e.g., a central processing unit or "CPU" 2 (FIG. 1). Other active semiconductor devices 3 that are mounted to a printed circuit or wiring board (PCB 4) and even the current flowing through the circuit traces 5, the connection device between CPU 2 and PCB 4 (the chip carrier, interposer, etc.,) generate thermal energy.

In order to maintain or increase the performance of such devices, they must be cooled in some way. The manner of cooling depends upon many parameters, including the space available for the cooling process, the temperatures to be encountered, etc. In some instances simply passing a fluid over the device or, over a finned heat sink that is attached to the device, is sufficient to maintain the semiconductor at safe operating temperatures. In one known semiconductor device cooling technique, convecting fins are attached to a semiconductor package, or the package is affixed to a larger metal member, referred to as a heat sink or cold plate. This heat sink draws heat away from the semiconductor device and can be air-cooled or liquid cooled, depending upon the particular application. If the heat sink is air-cooled it will typically have heat convecting fins.

Modern electronics equipment includes various active, heat-generating semiconductor components that require the use of connection devices for electrical connection with a PCB. As is known in the art, "land grid arrays" (LGA's) or "pin grid arrays" (PGA's) are examples of such connection devices, and are used when the active component to be connected has a plurality of contacts that are arranged in a regular pattern. Another connection device, known as an "interposer," connector (identified generally by reference numeral 6 in FIG. 1) typically comprises an array of contacts, elements, or pads supported in a flat housing so as to protrude from the top and bottom surfaces. Interposer 6 is placed between the active component 2 and PCB 4, or between two PCB's, and provides electrical connection between correspondingly positioned contact pads. LGA interposers described in the prior art may often include springs or conductive buttons inserted into an array of appropriately located holes in an insulating housing.

For example, in U.S. Pat. No. 6,264,476, incorporated herein by reference, an interposer for an LGA is disclosed that includes a dielectric housing having an array or grid of holes and a resilient, conductive button disposed in one or more of the holes. In U.S. Pat. No. 6,312,266, also incorporated herein by reference, a carrier is disclosed that provides improved retention to the individual contact elements resulting in an LGA interposer connector with improved manufacturability, reliability and more uniform mechanical and electrical performance. In one embodiment, the carrier includes upper and lower sections of dielectric material with an adhesive layer in between. Other prior art that may be relevant includes U.S. Pat. Nos. 5,528,456; 5,705,850; 6,299,460; 6,304,451; 6,078,500; and 6,317,326.

Numerous electronics systems require more and more current to be delivered through a connector and chip carrier to an array of semiconductor devices. This is especially true with current technology motherboards whose processors are clocked at speeds exceeding one gigahertz. For example, in each new generation of microprocessor, a greater number of transistors are packed onto each die, generating significantly more heat, and making the package thermal resistance critical. Furthermore, the trend toward shrinking semiconductor die sizes has caused higher power density, which strains the effectiveness of the package to dissipate heat.

There is a need in the art for an LGA interposer connector with improved manufacturability, reliability and more uniform mechanical and electrical performance, and that also provides enhanced thermal management capability through efficient heat transfer characteristics.

SUMMARY OF THE INVENTION

The invention provides a heat spreading interposer suitable for use with electronic components including those using land grid arrays and pin grid arrays. In one embodiment of the heat spreading interposer at least one electrical contact element is supported by a housing comprising a laminate. The laminated housing includes at least one layer of thermally conductive material supported by at least one layer of a dielectric material so that a portion of the at least one electrical contact element is in thermal communication with the at least one layer of thermally conductive material.

In another embodiment of the invention, a heat spreading interposer is provided including a plurality of electrical contact elements each having a first end and a second end. The electrical contact elements are supported by a housing so that the first end projects outwardly from a first side of the housing and the second end projects outwardly from a second side of the housing. The housing is formed from at least one layer of thermally conductive material supported by at least one layer of a dielectric material so that a portion of each of the plurality of electrical contact elements is in thermal communication with the at least one layer of thermally conductive material. In one aspect of the invention, the dielectric material comprises an injection molded polymer disposed in substantially surrounding relation to a lead frame that forms the at least one layer of thermally conductive material.

A method of spreading heat in an connection device is also provided in which an interposer is provided that comprises a plurality of electrical contacts supported by a housing. The housing is formed from at least one layer of thermally conductive material positioned between two layers of a dielectric material so that a portion of each of the plurality of electrical contacts is in thermal communication with the at least one layer of thermally conductive material. The interposer is positioned intermediate of an electronic device and a printed circuit board to conduct heat away from the electronic device and other heat generating components through the at least one layer of thermally conductive material.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF THE PREFERRED EMBODIMENTS

Figure 1:
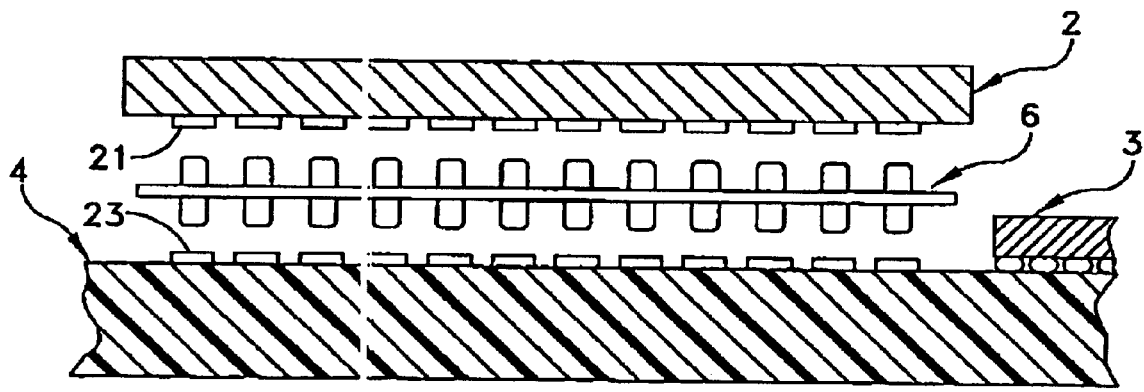
FIG. 1 is a side elevational view of a prior art electronics assembly including an interposer.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

Figure 3:
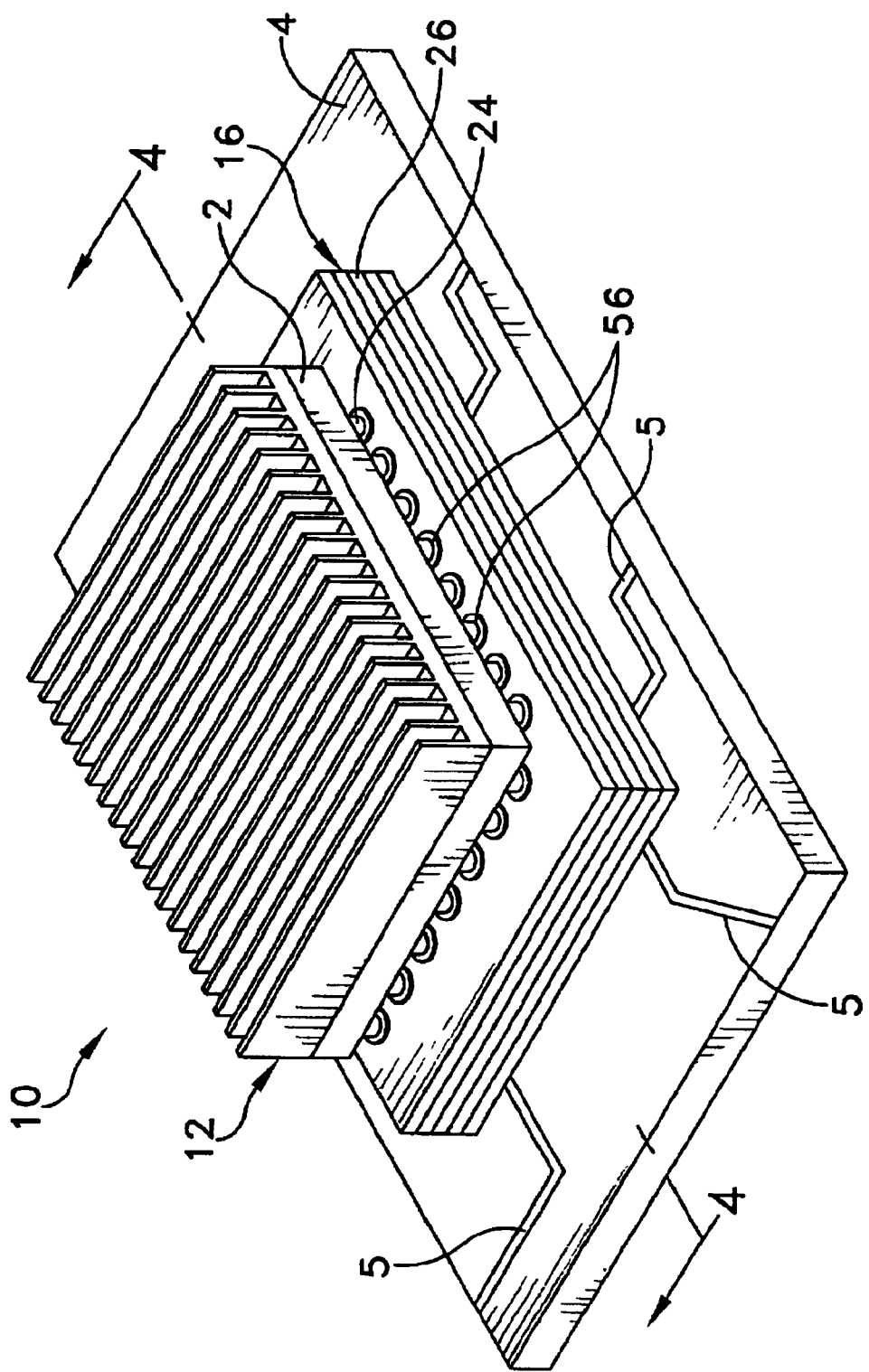
FIG. 3 is an electronic assembly formed in accordance with one embodiment of the present invention.

Referring to FIG. 3, a semiconductor heat source 2 is operatively connected with a PCB 4 by an electronic assembly 10 including a heat sink 12, and comprising an LGA interposer 16 formed in accordance with the present invention. More particularly, heat sink 12 may comprise any of the well known structures for removing heat from electronic components, e.g., a cold plate, a finned sink, a heat pipe, or some combination of these well known thermal management devices.

Semiconductor heat source 2 is often a large scale integrated circuit (LSI) or very large scale integrated circuit (VLSI) which are known to generate heat fluxes of several hundred watts per square centimeter, often at very localized portions of the device, known in the art as "hot spots". Of course, other heat generating components 3 and structures (e.g., circuit traces 5 or electrical contact elements) may be interconnected within electronic assembly 10. For example, individual PCB's that carry a variety of heat generating components 3, other electronic packages, chip carriers, or circuit carriers, e.g., a pin grid array (PGA) 11, shown in FIGS. 14 and 15, or the like may be connected or interconnected within electronics assembly 10.

Semiconductor heat source 2 typically comprises a plurality of contact pads 21 arranged in an array on at least one surface (FIG. 1). This array corresponds in size, shape, and pattern with another array of contact pads 23 on a confronting surface of PCB 4. The electrical and mechanical connection of plurality of contact pads 21 with array of contact pads 23 completes the electrical circuit, by allowing power and signals to be transferred between semiconductor heat source 2 and the remainder of the electronic system. It will be understood that a significant amount of the heat generated within electronics assembly 10 is due to resistance heating at the electrical and mechanical interface between contact pads 21 and contact pads 23. This resistance heating is exasperated by the industry trend toward positioning both ground and power contacts in a localized area such that a number of contact pads 21 and contact pads 23 that carry significant current loads are adjacent to one another. This arrangement creates an "connection hot spot." The LGA interposer of the present invention is ideally suited to relieve this problem in the art by allowing the heat generated at these resistance "hot spots" to be spread across the entire mass of LGA interposer 16.

Figure 2:
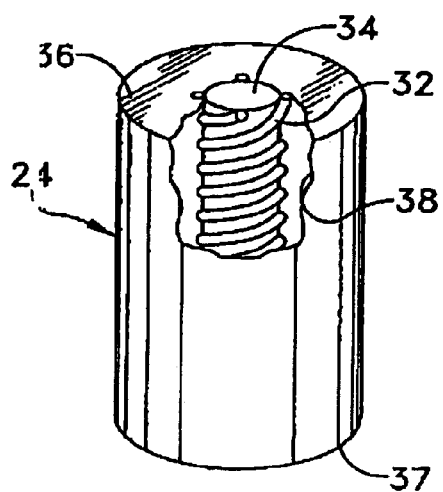
FIG. 2 is a perspective view of a contact button used in the interposer shown in FIG. 1.
Figure 4:
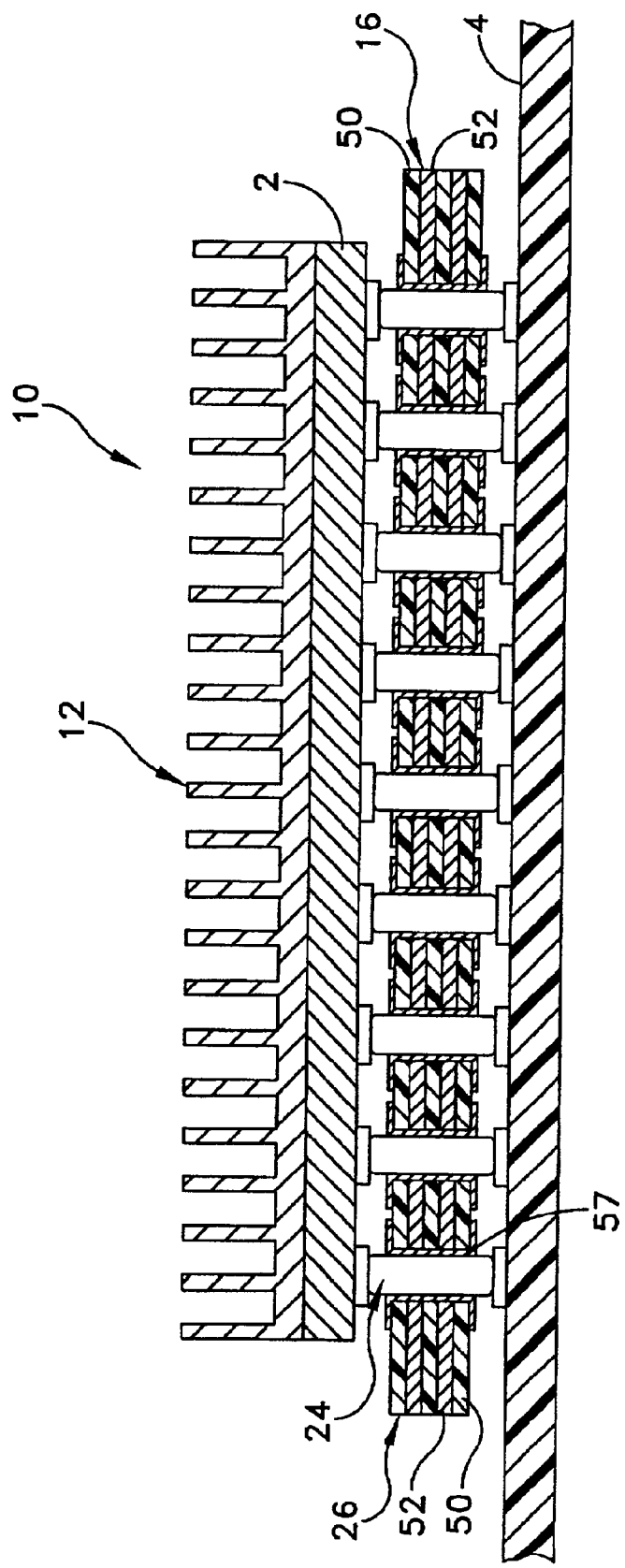
FIG. 4 is a cross-sectional view of the electronics assembly shown in FIG. 3, as taken along lines 4—4 in FIG. 3.
Figure 5:
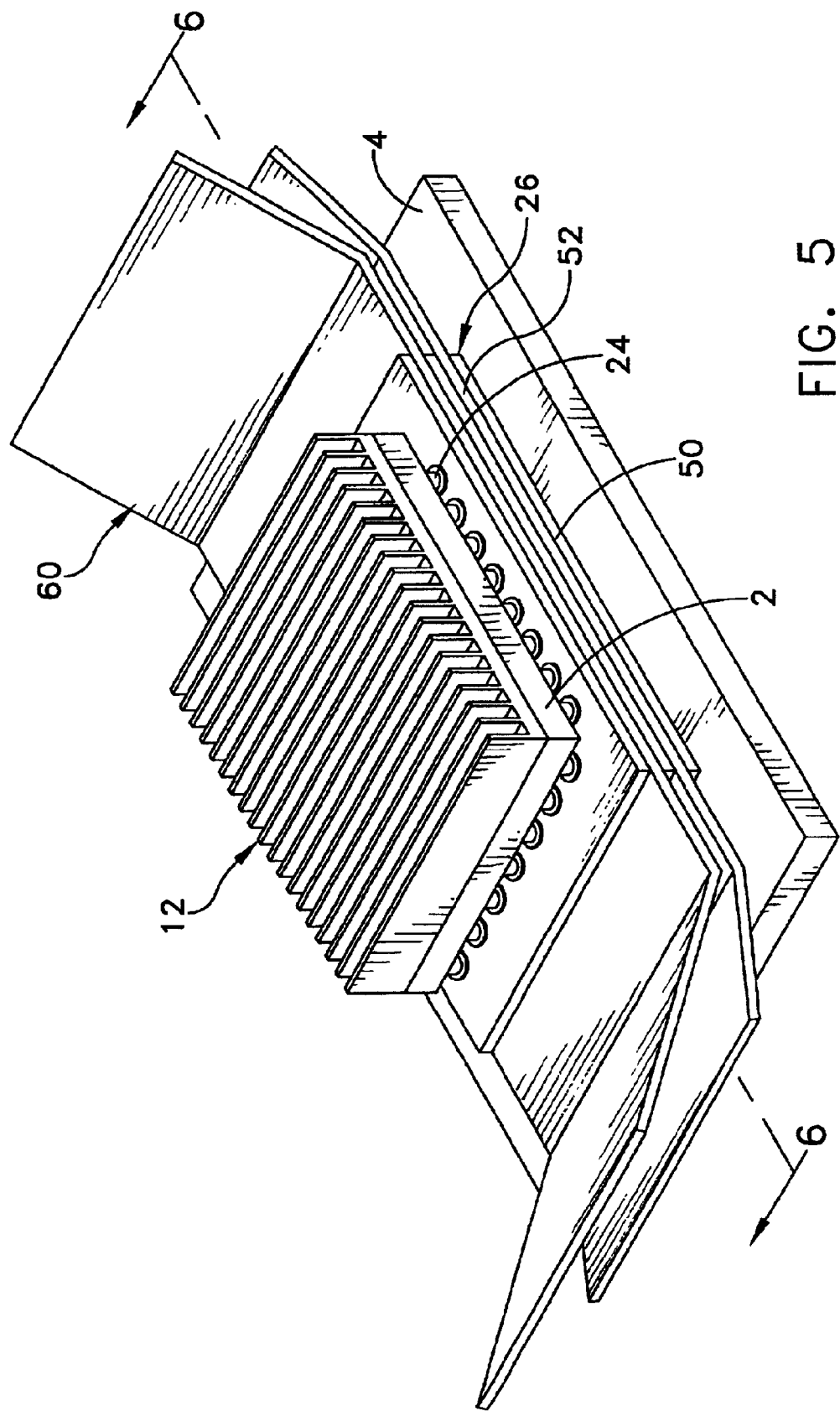
FIG. 5 shows an alternative embodiment heat spreading interposer positioned within an electronics assembly.
Figure 6:
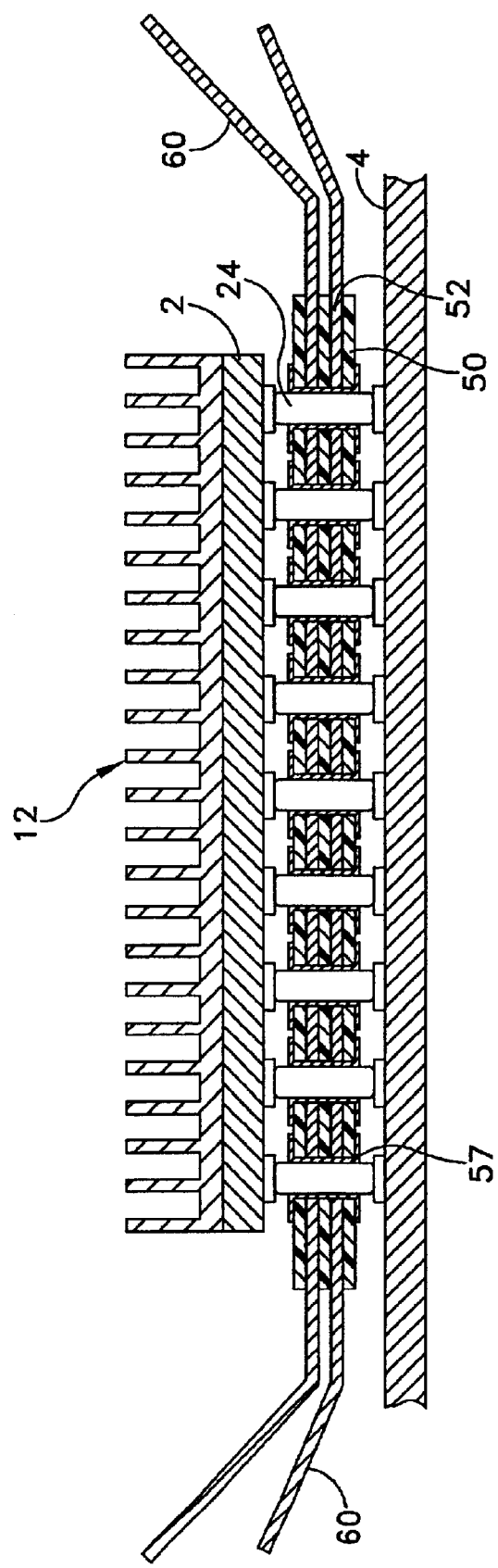
FIG. 6 is a cross-sectional view of the electronics assembly shown in FIG. 5, as taken along lines 6—6 in FIG. 5.
Figure 7:
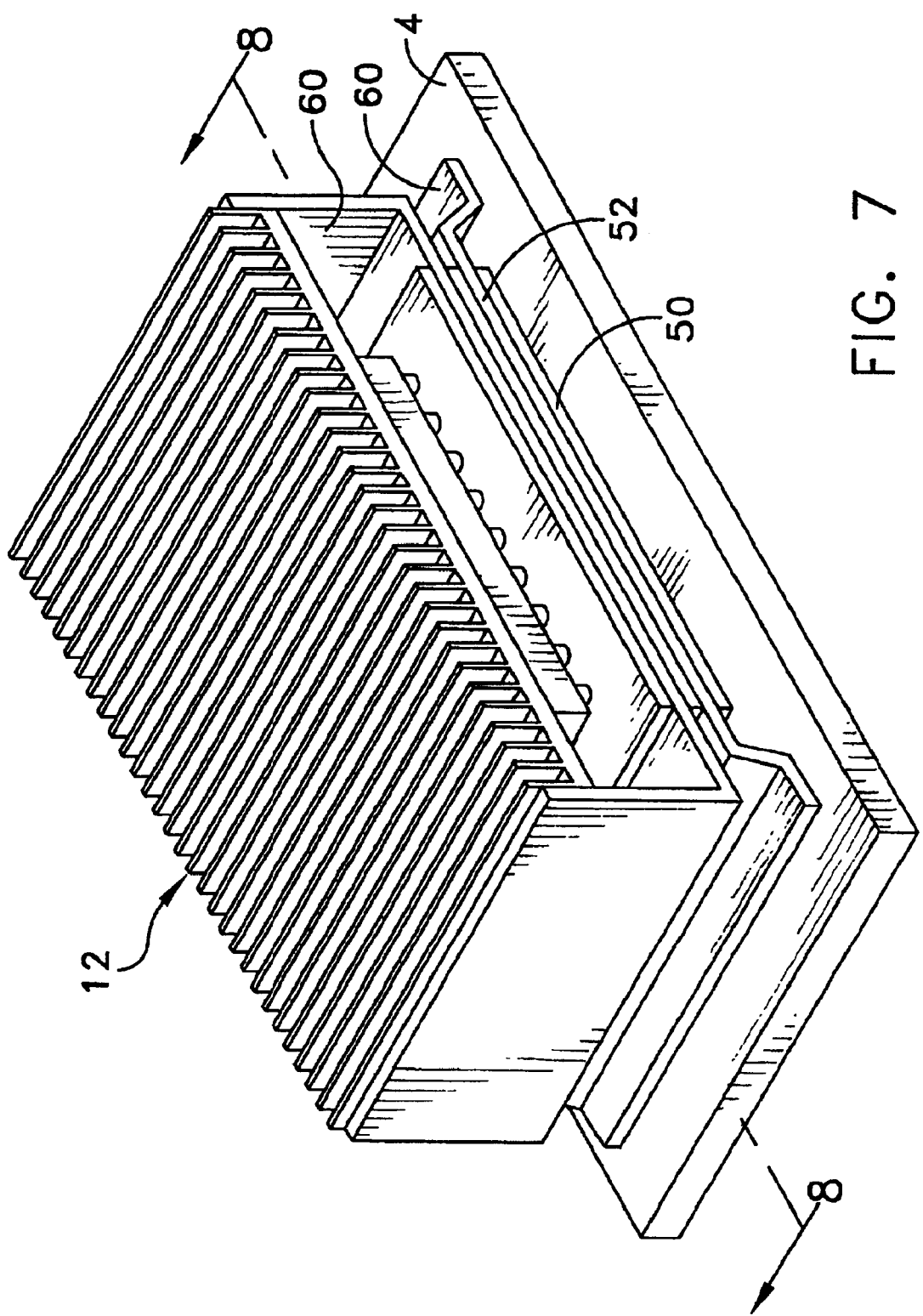
FIG. 7 is another embodiment of an electronics assembly formed in accordance with the present invention.

Referring to FIGS. 2 and 4, LGA interposer 16 of the present invention includes a plurality of resilient conductive contact buttons 24 mounted in a laminated housing 26. More particularly, each contact button 24 comprises a flexible conducting element 32 that is wound around a compressible insulating core 34. Compressible insulating core 34 extends from a first end 36 to a second end 37 of contact button 24, and typically comprises an insulating yarn or other suitable dielectric material. A compressible outer shell 38 surrounds flexible conducting element 32, and is in contact with both flexible conducting element 32 and compressible insulating core 34. Compressible outer shell 38 is best formed from an elastomer, such as, silicone rubber, neoprene, or polybutadiene. Flexible conducting element 32 and compressible insulating core 34 are embedded in compressible outer shell 38, so that the outer shell-to-conducting element engagement is along substantially the entire length of flexible conducting element 32.

The rigidity of flexible conducting element 32 is chosen so that when contact button 24 is elastically compressed, the areas of interface between flexible conducting element 32, compressible insulating core 34, and compressible outer shell 38 create a substantially corresponding displacement in both flexible conducting element 32 and compressible outer shell 38. This allows first end 36 and second end 37 to establish and maintain contact with a correspondingly positioned contact pad 21 of semiconductor heat source 2 and contact pad 23 of PCB 4, respectively.

When semiconductor heat source 2 is aligned with PCB 4, and LGA interposer 16 is positioned between them, contact buttons 24 are depressed so as to form the electrical connection between array of contact pad arrays 21, 23. The resilience of contact buttons 24 allows for some degree of nonplanarity in the components, while maintaining good electrical contact between the arrays of contacts.

Figure 8:
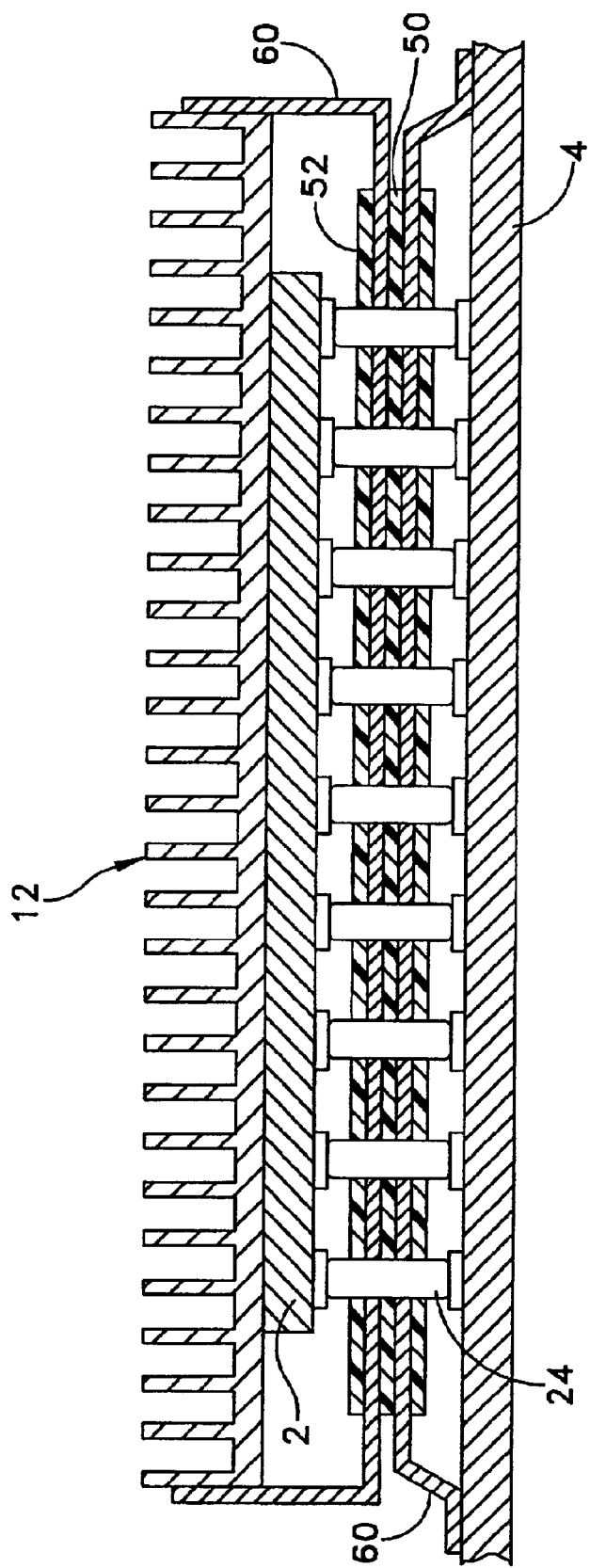
FIG. 8 is a cross-sectional view of the electronics assembly shown in FIG. 7, as taken along lines 8—8 in FIG. 7.
Figure 9:
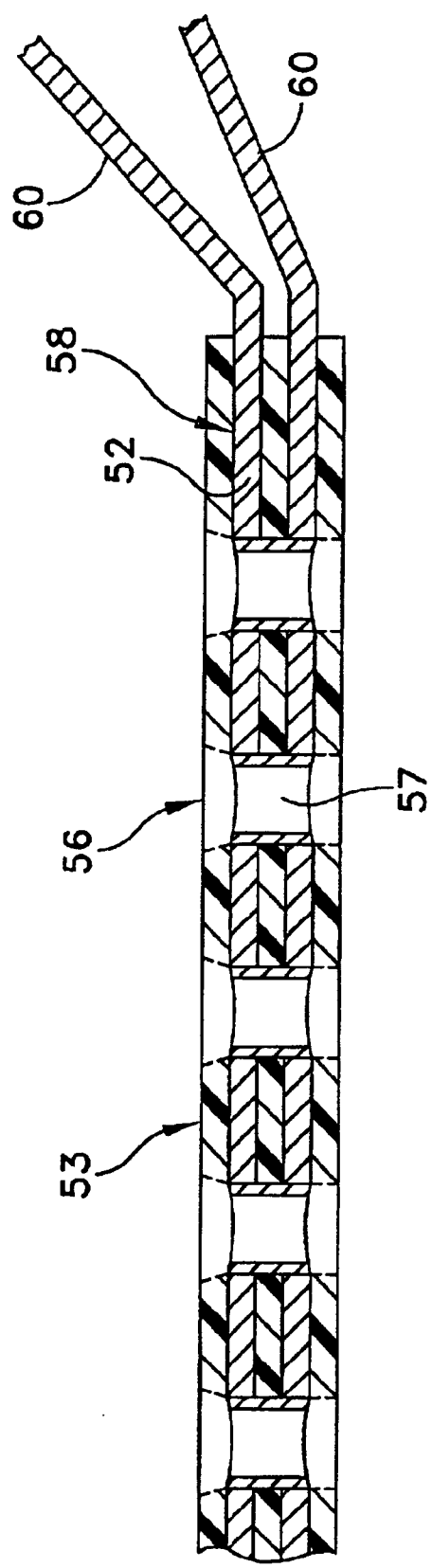
FIG. 9 is a cross-sectional view of an alternative housing that is formed by insert molding polymer over top of a lead frame.
Figure 10:
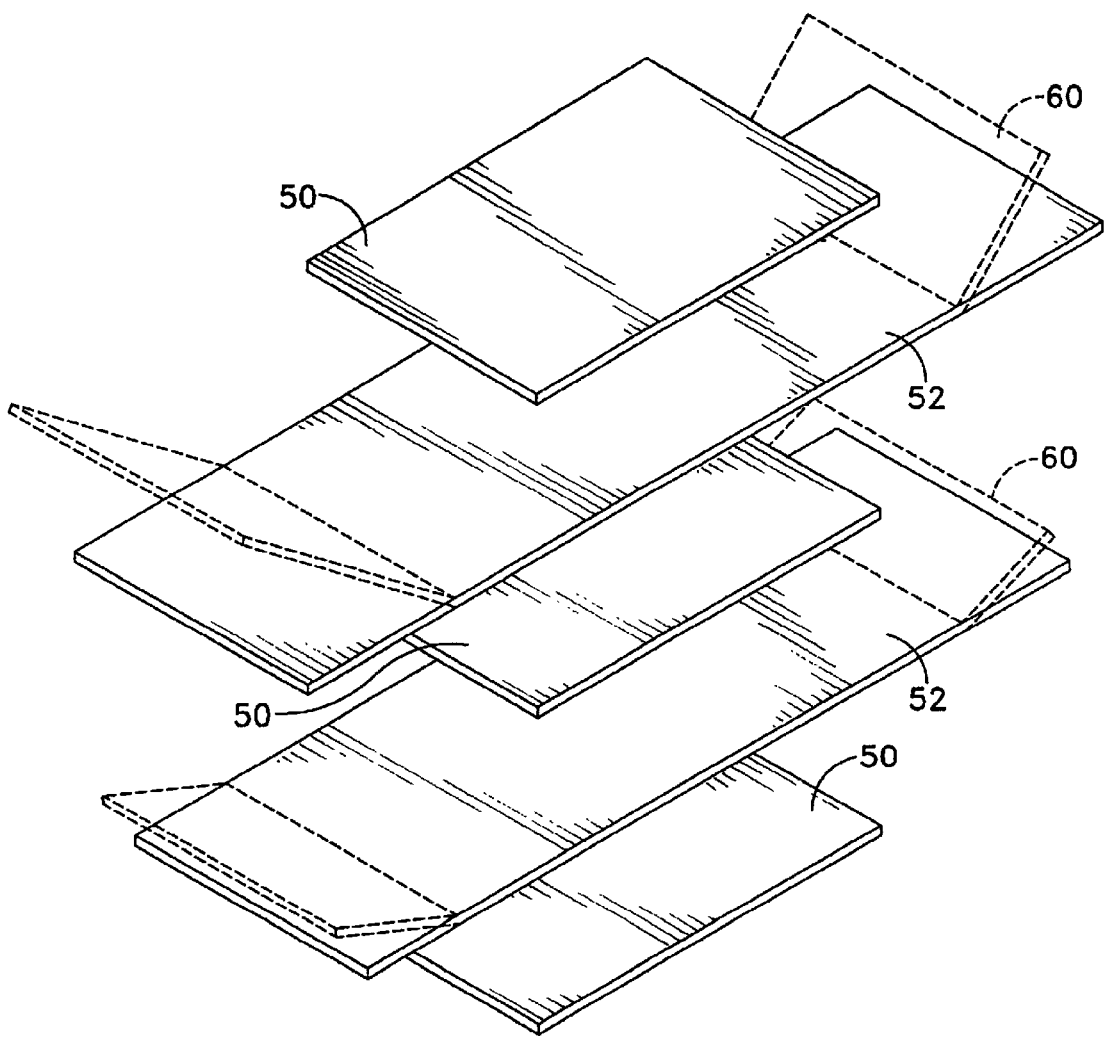
FIGS. 10 and 11 are partially schematic exploded perspective views of a plurality of dielectric material layers and thermally conductive material layers positioned so as to be laminated together to form one or more laminated housings in accordance with the present invention.

Referring to FIGS. 3–13, laminated housing 26 is advantageously formed by laminating a plurality of dielectric layers 50 and a plurality of thermally conductive layers 52 together, i.e., superposing, interleaved layers of dielectric material 50 and thermally conductive material 52 (FIG. 10). More particularly, dielectric layers 50 typically comprise an electrically insulating material, such as an epoxy-glass or polyamide based insulating material, e.g. FR4. These materials are preferred because of their coefficient of thermal expansion (CTE) which substantially matches the CTE of the surrounding structures. Typically, dielectric layers 50 will each have a thickness of about 0.003 inches to about 0.007 inches, and preferrably about 0.005 inches.

At least one thermally conductive layer 52 is positioned or sandwhiched between two adjacent dielectric layers 50 (FIG. 4). Each thermally conductive layer 52 comprises an efficient heat transfer material, such as a metal, e.g., copper, aluminum, etc., but can be any material that is thermally conductive and able to be laminated with one or more dielectric layers 50. In one preferred embodiment, approximately two ounces of copper are used for each thermally conductive layer 52. Typically, each thermally conductive layer 52 will have a thickness of about 0.001 inches to about 0.005 inches, and preferrably about 0.003 inches.

Figure 11:
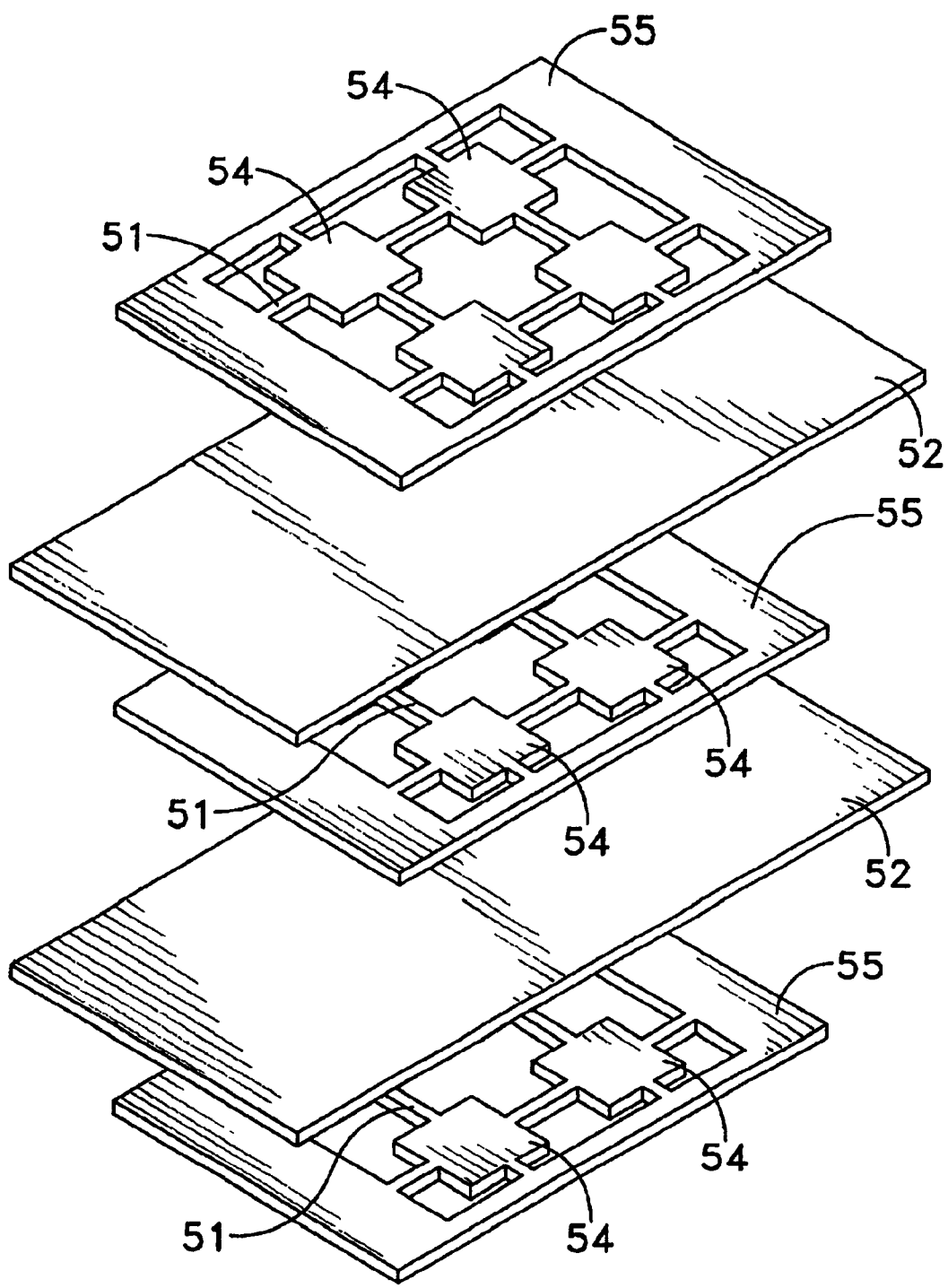

Laminated housing 26 may be manufactured as a series of individual housing in which a plurality of dielectric and thermally conductive layers or laminated together to form a single housing (FIG. 10). Alternatively, laminated housing 26 may be formed as a part of a mass production process in which a plurality of individual dielectric layers 54 are preformed from sheets 55 of dielectric material (FIG. 11). Each individual dielectric layer 54 is held in a matrix by straps 51. Sheets 55 are then laminated together with a plurality of thermally conductive layers 52 so as to form a plurality of laminated housings 26. During subsequent processing steps, the individual laminated housings 26 may be released from sheets 55 by simply severing straps 51. This technique allows for improved manufacturability, reliability and more uniform mechanical and electrical performance of interposer 16.

Of course, it will be understood that an alternative housing may also be formed by insert molding one or more thermally conductive layers 52 within a polymer housing 53, via conventional injection molding (FIG. 9). Injection molded housing 53 of LGA interposer 16 may be formed from one of the well known polymer materials that are suitable for use in electronic connection systems, e.g., polyhalo-olefins, polyamides, polyolefins, polystyrenes, polyvinyls, polyacrylates, polymethacrylates, polyesters, polydienes, polyoxides, polyamides and polysulfides and their blends, co-polymers and substituted derivatives thereof.

Figure 12:
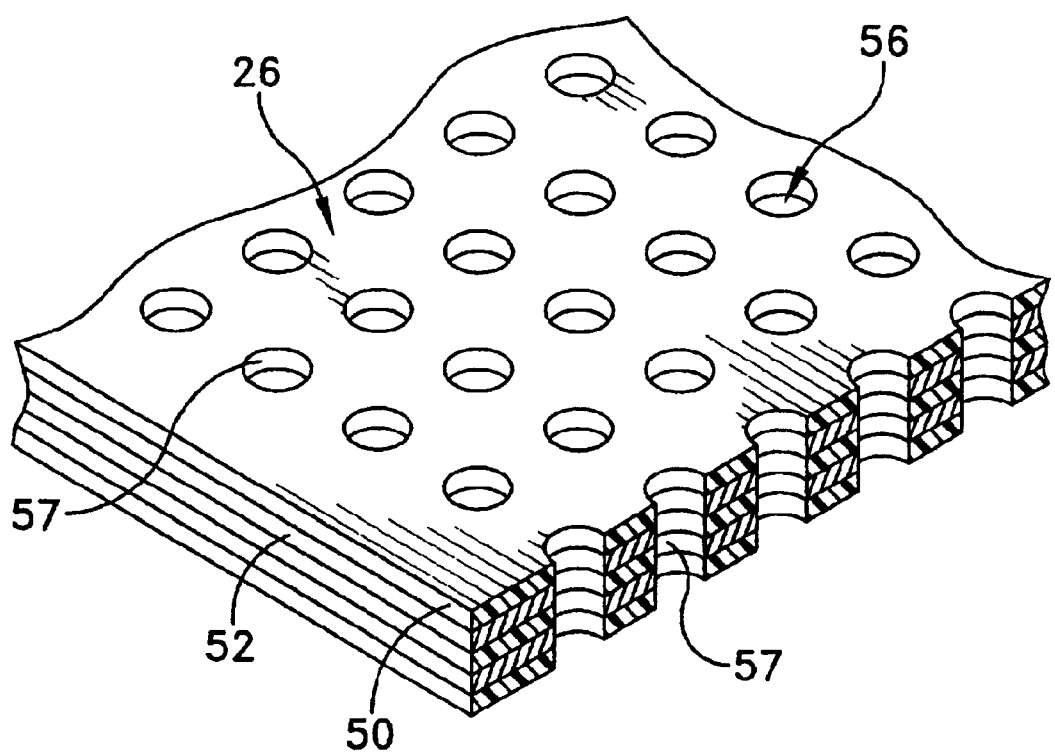
FIG. 12 is a perspective view, partially in cross-section, of a laminated housing formed in accordance with the present invention.

One preferred embodiment of the present invention may be formed by precisely and accurately drilling an array of holes 56 within a laminated housing 26 (FIG. 12). Holes 56 may be used as formed by the drilling process, or may have a thermal conductor electro-deposited onto the surface of laminated housing 26 defining the hole so as to form a thermally conductive liner 57. Of course, other techniques may be used to form holes 56, e.g., chemical etching with one or a series of photoresist masks, or other chemical milling processes or laser drilling methods that are known in the art. If insert molded housing 53 is to be used in forming an LGA interposer according to the invention, holes 56 and liner 57 will be formed as a part of one or more lead frames 58 that also form thermally conductive layers 52 (FIG. 9). Lead frames 58 are placed into an injection mold cavity prior to injecting polymer. This technique is conventional, and well known in the art of insert molding for the production of connection devices.

In any case, a contact button 24 is mounted in each hole 56 so as to form an LGA interposer 16. In this way, an annular edge of each thermally conductive layer 52 is thermally engaged with a portion of each contact button 24, either by thermal communication through liner 57 (FIG. 4) within each hole 56 or by direct thermal communication with an annular edge of each thermally conductive layer 52 (FIG. 8). In particular, as each contact button 24 is mounted within a hole 56, the outer surface of compressible outer shell 38 engages either liner 57 or an annular edge of each thermally conductive layer 52. Either of these arrangements will place each contact button 24 in heat transfer communication with each thermally conductive layer 52. When LGA interposer 16 is positioned within an electronic assembly 10, and power is provided to semiconductor heat source 2, thermally conductive layers 52 transfer and spread heat generated at localized hot spots engaged with certain of contact buttons 24 to one or more other contact buttons 24 that are spaced away from those hot spots.

Figure 13:
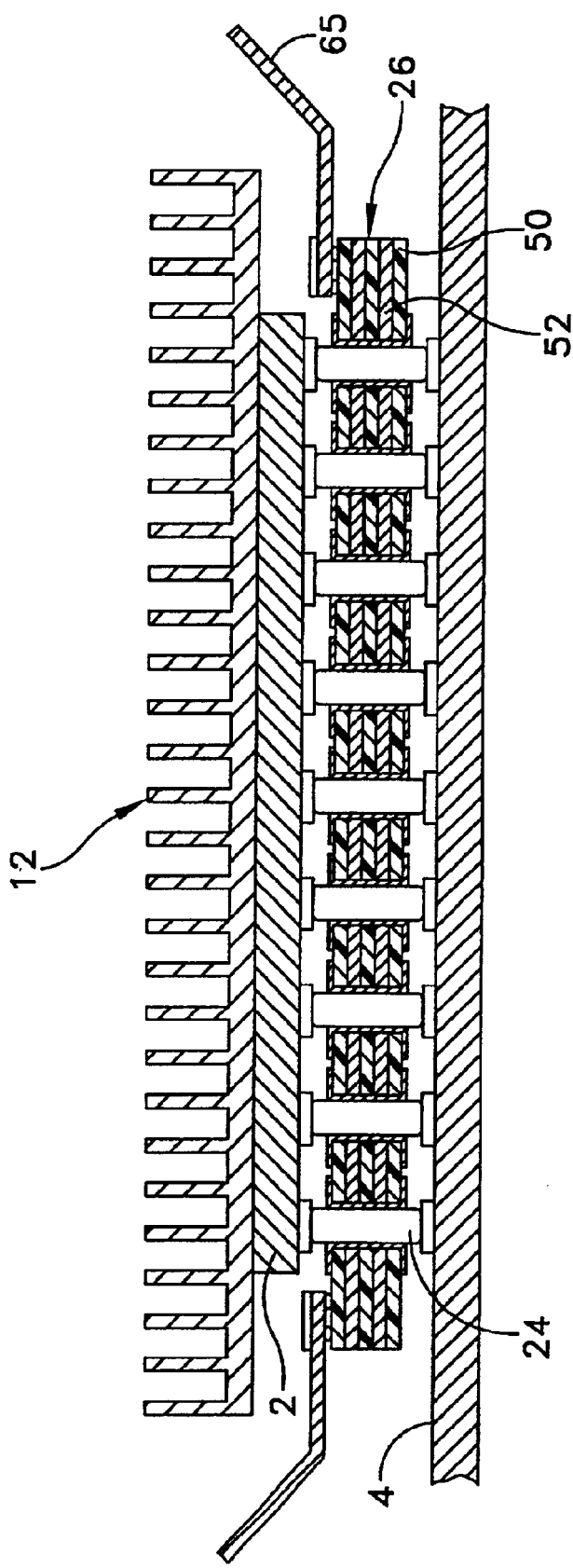
FIG. 13 is a cross-sectional view, similar to FIG. 6, but showing an alternative method of attaching wings to a laminated housing formed in accordance with the present invention.

In the case PCB 4 has adequate thermal resistance, the thermal energy generated by semiconductor heat source 2 and spread through contact buttons 24 will be dissipated. However, in the event PCB 4 is not adequate for dissipating the necessary amount of thermal energy, one or more thermally conductive layers 52 may be sized larger than LGA interposer 16 so as to form one or more wings 60. Referring to FIGS. 5–8) wings 60 may be formed by laminating one or more thermally conductive layers 52 that are sized so as to exceed either the length, width, or both dimensions of dielectric layers 50 forming laminated housing 26 or molded housing 53. In this way, wings 60 project outwardly from one or more edges of laminated housing 26 or molded housing 53 so as to form heat radiators to dissipate heat into the ambient environment by, e.g., convection, conduction, or both. Wings 60 may also be engaged in thermal communication with other heat spreaders, e.g., heat pipes, fins, fans, conduits, or other heat sinks, that are mounted on or adjacent to electronic assembly 10. Additionally, one or more wings 60 may thermally communicate directly with PCB 4. In one embodiment, discrete wings 65 are thermally bonded to at least one thermally conductive layer 52 (FIG. 13).

Thus the present invention provides an LGA interposer connector capable of enhanced thermal management in electronic systems through an integral heat transfer structure. It is to be understood that the present invention is by no means limited only to the particular constructions herein disclosed and shown in the drawings, but also comprises any modifications or equivalents within the scope of the claims.

Figure 14:
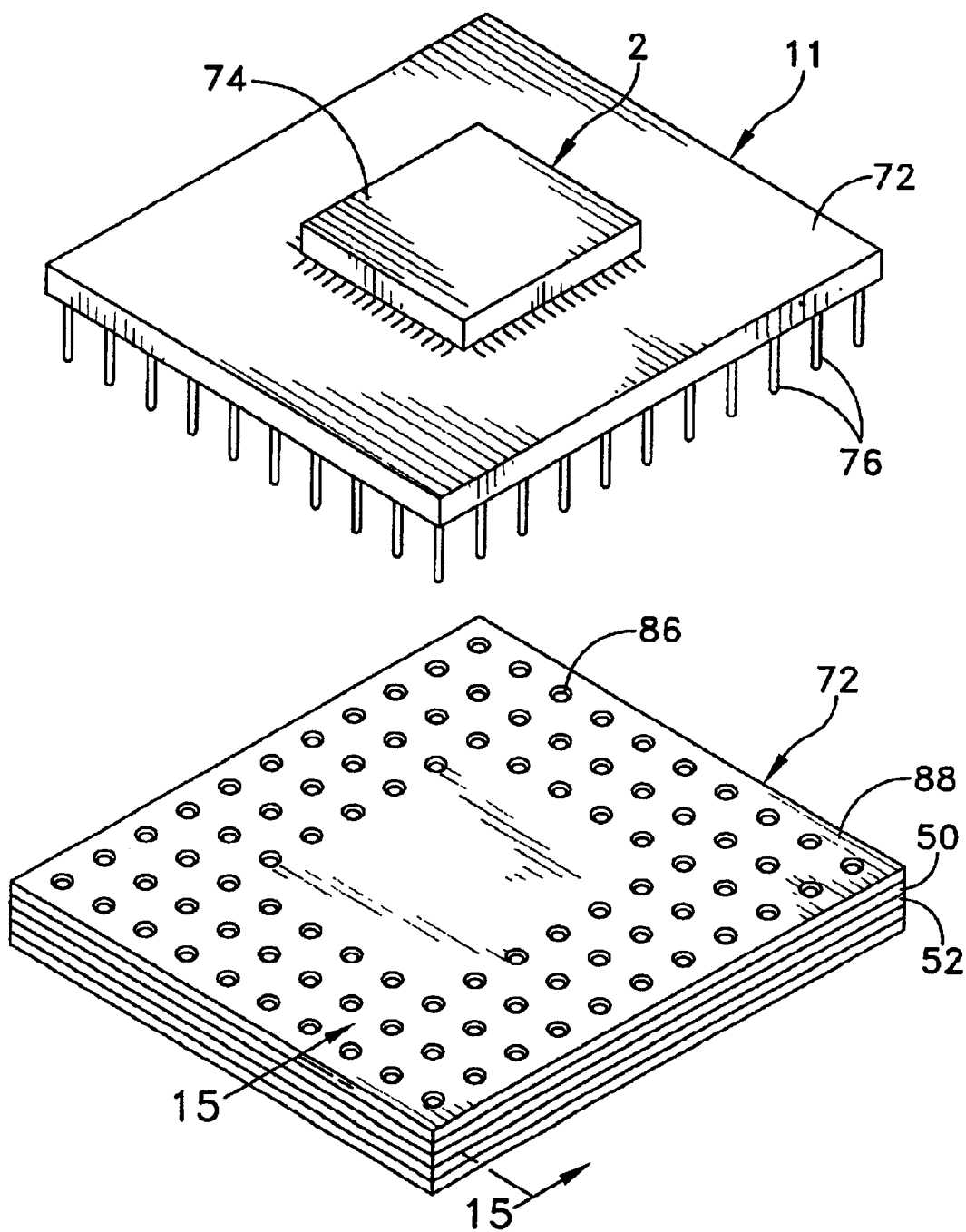
FIG. 14 is a perspective view of a semiconductor chip mounted to a pin grid array positioned above a pin grid array socket formed in accordance with the present invention.
Figure 15:
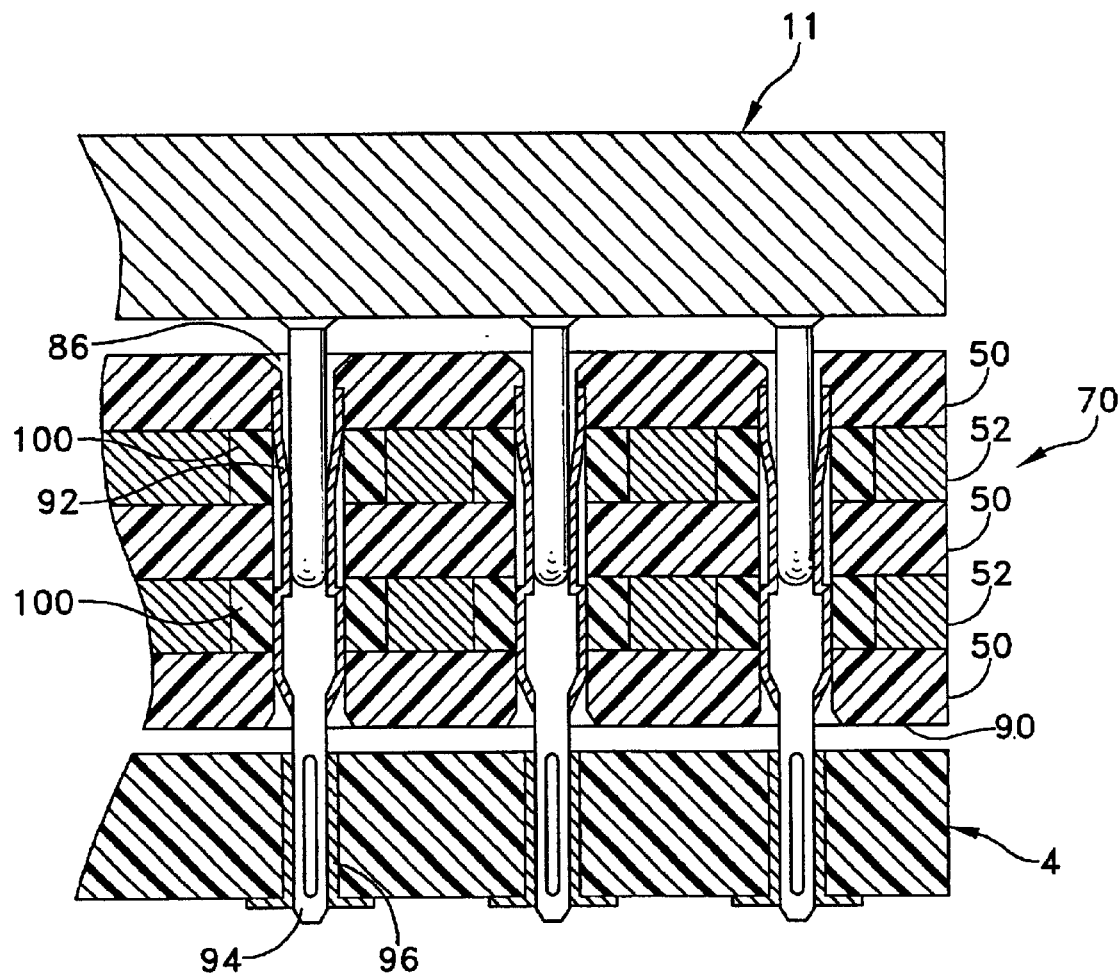
FIG. 15 is a broken-away, cross-sectional view of the pin grid array socket shown in FIG. 14, as taken along lines 15—15 in FIG. 14.

For example, and referring to FIGS. 14 and 15, an electronic assembly may comprise a semiconductor heat source 2 mounted to a PGA chip carrier 11 and a PGA socket 70 mounted to a PCB 4. More particularly, PGA chip carrier 11 is typically a square of ceramic 72 having an integrated circuit chip 74 mounted on either its upper or lower surface. A plurality of pins 76 are connected to integrated circuit chip 74, and depend from square ceramic 72 in a spaced array near the marginal portions of square ceramic 72.

PGA socket 70 comprises a laminated housing 80 supporting a plurality receptacle terminals 92. More particularly, laminated housing 80 is similar in construction to laminated or insert molded housing 26. Thus, laminated housing 80 is advantageously formed by laminating a plurality of dielectric layers 50 and a plurality of thermally conductive layers 52 together, i.e., superposing, interleaved layers of dielectric material 50 and thermally conductive material 52 (FIG. 15). Here again, dielectric layers 50 typically comprise an electrically insulating material, such as an epoxy-glass or polyamide based insulating material, e.g. FR4. At least one thermally conductive layer 52 is positioned or sandwhiched between two adjacent dielectric layers 50 (FIG. 15). Each thermally conductive layer 52 comprises an efficient heat transfer material, such as a metal, e.g., copper, aluminum, etc., but can be any material that is thermally conductive and able to be laminated with one or more dielectric layers 50. A plurality of contact passages 86 extend between a mating face 88 and a mounting face 90 of PGA socket 70.

Plurality of receptacle terminals 92 are each mounted in a respective contact passage 86. Each receptacle terminal 92 has an elongated receptacle portion, with at least two opposed spring arms formed from the sides to extend into the receptacle so as to make a wiping engagement with a pin 76. Receptacle terminals 92 are also provided with a mounting tail 94 which is profiled to be received in a plated-through hole 96 of PCB 4. Mounting tail 94 may include any of the well known through-hole connection technologies, e.g., compliant pin, wedge pin, or a simple wave solder tail. Advantageously, electrically insulating shields 100 are positioned between the edges of thermally conductive layers 52 that open onto contact passages 86 so that circuit integrity is maintained within PGA 70. It will be understood that ground and power planes may also be defined within laminated housing 80.

What is claimed is:

1. A heat spreading interposer comprising:
at least one flexible electrical contact supported by a laminated housing such that a first end of said at least one flexible electrical contact projects outwardly from a first side of said housing and a second end of said at least one flexible electrical contact projects outwardly from a second side of said housing, wherein said laminated housing comprises at least one layer of thermally conductive material supported by at least one coextensive layer of a dielectric material so that a portion of said at least one flexible electrical contact is (i) engaged, and (ii) in thermal communication with said at least one layer of thermally conductive material.

2. A heat spreading interposer according to claim 1 wherein said laminated housing comprises a plurality of dielectric layers and a plurality of thermally conductive layers.

3. A heat spreading interposer according to claim 1 wherein said dielectric layers comprise a thermally conductive insulator.

4. A heat spreading interposer according to claim 1 wherein said dielectric layers each have a thickness of about 0.003 inches to about 0.007 inches.

5. A heat spreading interposer according to claim 1 wherein said at least one layer of thermally conductive material has a thickness of about 0.001 inches to about 0.005 inches.

6. A heat spreading interposer according to claim 1 wherein said portion of said at least one flexible electrical, contact is engaged with an annular edge of each of said at least one layers of thermally conductive material.

7. A heat spreading interposer according to claim 1 wherein said laminated housing defines a plurality of holes each having a thermally conductive liner that is arranged in thermal communication with said at least one layer of thermally conductive material wherein each of said flexible electrical contacts are thermally engaged with a portion of said liner.

8. A heat spreading interposer according to claim 1 wherein said at least one layer of thermally conductive material is sized larger than said laminated housing so as to form at least one wing projecting outwardly from at least one edge of said laminated housing so as to dissipate heat into the ambient environment.

9. A heat spreading interposer according to claim 8 wherein said at least one wing is engaged in thermal communication with a heat sink.

10. A heat spreading interposer according to claim 8 wherein at least one discrete wing is thermally bonded to at least one thermally conductive layer.

11. A heat spreading interposer comprising:
plurality of compressible electrical contact elements each having a first end and a second end and supported by a laminated housing so that said first end projects outwardly from a first side of said laminated housing and said second end projects outwardly from a second side of said laminated housing; wherein said laminated housing is formed from at least one layer of thermally conductive material supported by at least one coextensive layer of a dielectric material so that a portion of each of said plurality of compressible electrical contacts engages an annular edge of said at least one layers of thermally conductive material so as to be in thermal communication with said at least one layer of thermally conductive material.

12. A heat spreading interposer according to claim 11 wherein at least one thermally conductive layer, comprises a lead frame and said two layers of dielectric material comprise a polymer disposed in surrounding relation to portions of said lead frame.

13. A heat spreading interposer according to claim 11 wherein said laminated housing defines a plurality of holes each having a portion of said lead frame arranged in thermal communication one of said compressible electrical contacts.

14. A heat spreading interposer according to claim 11 wherein said lead frame is sized larger than said laminated housing so as to form at least one wing projecting outwardly from at least one edge of said laminated housing so as to form a heat radiator to dissipate heat into the ambient environment.

15. A heat spreading interposer according to claim 14 wherein said at least one wing is engaged in thermal communication with a heat sink.

16. A heat spreading interposer according to claim 14 wherein at least one discrete wing is thermally bonded to a portion of said lead frame.

17. A method of heat dissipation for an electronic device, comprising:
 providing an interposer comprising plurality of flexible electrical contacts supported by a laminated housing wherein said housing is formed from at least one layer of thermally conductive material supported by at least one coextensive layer of a dielectric material so that a portion of each of said plurality of flexible electrical contacts is (i) engaged, and (ii) in thermal communication with said at least one layer of thermally conductive material;
  a. positioning said interposer intermediate an electronic device and a printed circuit board; and
  b. conducting heat away from said electronic device through said at least one layer of thermally conductive material.

18. The method of claim 17 further comprising providing a heat transfer wing to said at least one layer of thermally conductive material.

19. The method of claim 18 wherein said heat transfer wing is thermally engaged with a heat transfer device.

20. The method of claim 19 wherein said heat transfer device is selected from the group of heat transfer devices consisting of printed circuit boards, heat transfer devices attached to printed circuit boards, fins extended into ambient air from said thermally conductive material, passive heat transfer devices, pins associated with the electronic device, and active heat transfer devices.

21. The method of claim 17 wherein said interposer connects at least one of a land grid array mounted electronic device and a pin grid array mounted electronic device.

* * * * *

UNITED STATES PATENT AND TRADEMARK OFFICE
CERTIFICATE OF CORRECTION

PATENT NO. : 6,712,621 B2
DATED : March 30, 2004
INVENTOR(S) : Che-Yu Li et al.

It is certified that error appears in the above-identified patent and that said Letters Patent is hereby corrected as shown below:

Column 8,
Line 19, change "electrical, contact" to -- electrical contact --

Signed and Sealed this

Twenty-second Day of March, 2005

JON W. DUDAS
*Director of the United States Patent and Trademark Office*